(12) United States Patent
Kang et al.

(10) Patent No.: US 7,515,459 B2
(45) Date of Patent: Apr. 7, 2009

(54) METHOD OF PROGRAMMING A MEMORY CELL ARRAY USING SUCCESSIVE PULSES OF INCREASED DURATION

(75) Inventors: Sang-beom Kang, Hwaseong-si (KR);
Du-eung Kim, Yongin-si (KR);
Beak-hyung Cho, Hwaseong-si (KR);
Hye-jin Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 178 days.

(21) Appl. No.: 11/315,129

(22) Filed: Dec. 23, 2005

(65) Prior Publication Data
US 2006/0221679 A1  Oct. 5, 2006

(30) Foreign Application Priority Data
Apr. 4, 2005  (KR) ...................... 10-2005-0028086

(51) Int. Cl.
*G11C 11/00* (2006.01)
*G11C 7/00* (2006.01)

(52) U.S. Cl. ................... 365/163; 365/191; 365/189.16

(58) Field of Classification Search ................. 365/148, 365/163, 185.19, 194, 189.16, 191
See application file for complete search history.

(56) References Cited

U.S. PATENT DOCUMENTS

| 6,487,113 | B1 | 11/2002 | Park et al. | |
|---|---|---|---|---|
| 6,750,469 | B2 | 6/2004 | Ichihara et al. | |
| 6,813,177 | B2 | 11/2004 | Lowrey et al. | |
| 7,050,328 | B2 * | 5/2006 | Khouri et al. | 365/163 |
| 2003/0223285 | A1 * | 12/2003 | Khouri et al. | 365/200 |
| 2005/0036364 | A1 * | 2/2005 | Ha et al. | 365/163 |
| 2005/0141261 | A1 * | 6/2005 | Ahn | 365/148 |

* cited by examiner

*Primary Examiner*—J. H. Hur
(74) *Attorney, Agent, or Firm*—Volentine & Whitt, PLLC

(57) ABSTRACT

A method of programming a memory array including a plurality of memory cells is provided. The memory cells may include phase-change memory elements. In one aspect, the method includes applying in succession first through $n^{th}$ current pulses to each of the memory cells to be programmed to a first state (e.g., a crystalline state), where a current amplitude of the first through $n^{th}$ current pulses decreases with each successive pulse, and where a pulse duration of the first through $n^{th}$ current pulses increases with each successive pulse.

8 Claims, 4 Drawing Sheets

METHOD OF PROGRAMMING A MEMORY CELL ARRAY USING SUCCESSIVE PULSES OF INCREASED DURATION

BACKGROUND OF THE INVENTION

1. Field of the Invention

The present invention generally relates to semiconductor memories, and more particularly, the present invention relates to method of programming a memory cell array.

A claim of priority is made to Korean Patent Application No. 10-2005-0028086, filed Apr. 4, 2005, in the Korean Intellectual Property Office, the entirety of which is incorporated herein by reference.

2. Description of the Related Art

A phase-change random access memory (PRAM), also known as an Ovonic Unified Memory (OUM), includes a phase-change material such as a chalcogenide alloy which is responsive to heat so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by heating the material in excess of its melting point temperature for a relatively short period of time. On the other hand, the phase-change material is set to a crystalline state by heating the material below its melting point temperature for a longer period of time. In each case, the material is allowed to quickly cool to its original temperature after the heat treatment.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

In addition to the differing resistive characteristics mentioned above, the phase-change material exhibits a relatively low reflexibility in its amorphous state, and a relatively high reflexibility in its crystalline state.

FIGS. 1A and 1B illustrate a memory cell 10 in a 'set' state and in a 'reset' state, respectively, and FIG. 2 is an equivalent circuit diagram of the memory cell 10 of FIGS. 1A and 1B. As shown, the memory cell 10 includes a phase-change element C and an access transistor 20 connected in series between a bit line BL and a reference potential (e.g., ground). Also, as shown, a gate of the access transistor 20 is connected to a word line.

It should be noted that the structure of the phase-change element C is presented as an example only, and that other structures may be possible. Similarly, the connections illustrated in FIGS. 1A, 1B and 2 are presented as examples only, and other configurations are possible. For example, the memory cell 10 may include the phase-change element C and a diode (not shown) connected in series between the bit line BL and the word line WL.

In each of FIGS. 1A and 1B, the phase-change element C includes a top electrode 12 formed on a phase-change material 14. In this example, the top electrode 12 is electrically connected to a bit line BL of a PRAM memory array (not shown). A conductive bottom electrode contact (BEC) 16 is formed between the phase-change material 14 and a conductive bottom electrode 18. The access transistor 20 is electrically connected between the bottom electrode 18 and the reference potential, and the gate of the access transistor 20 is electrically connected to a word line WL of the PRAM cell array (not shown).

In FIG. 1A, the phase-change material 14 is illustrated as being in its crystalline state. As mentioned previously, this means that the memory cell 10 is in a low-resistance 'set' state or logic 0 state. In FIG. 1B, a portion of the phase-change material 14 is illustrated as being amorphous. Again, this means that the memory cell 10 is in a high-resistance 'reset' state or logic 1 state.

The set and reset states of the memory cell 10 of FIGS. 1A and 1B are establish by controlling the magnitude and duration of current flow through the BEC 16. That is, as shown in FIG. 2, the memory cell 10 is activated (or accessed) by operation of the access transistor 20 which is responsive to a voltage of the word line WL. When activated, the phase-change element C is programmed according to the voltage of the bit line BL. More specifically, the bit line BL voltage is controlled to establish a programming current ICELL which causes the BEC 16 to act as a resistive heater which selectively programs the phase-change material 14 in its 'set' and 'reset' states. This is explained in more detail below with reference to FIG. 3.

FIG. 3 illustrates an example of temperature pulse characteristics of phase-change material as the phase-change material is programmed in the 'set' and 'reset' states. In particular, reference number 35 denotes the temperature pulse of the phase-change material programmed to its 'reset' state, and reference number 36 denotes the temperature pulse of the phase-change material programmed to its 'set' state.

As shown in FIG. 3, when the phase-change material is programmed to its 'reset' state, the temperature of the material is increased above its melting temperature Tm (e.g., 610° C.) for a relatively short period of time, and then allowed to rapidly cool. In contrast, when the phase-change material is programmed to its 'set' state, the temperature of the material is increased to below its melting point Tm and above its crystallizing temperature Tx (e.g., 450° C.) for a longer period of time, and then allowed to cool. The temperature range between the melting temperature Tm and the crystallizing temperature Tx is referred to as the "set window".

FIG. 4 is a diagram showing a set current pulse I_SET and a reset current pulse I_RESET that is applied to the phase-change memory cell in order to achieve the temperature pulse characteristics shown in FIG. 3. More particularly, the reset current pulse I_RESET is applied to achieve the temperature pulse 35 of FIG. 3, and the set current pulse I_SET is applied to achieve the temperature pulse 36 of FIG. 3. As one would expect, a larger current pulse of shorter duration is applied to place the phase-change material in its amorphous state than in its crystallize state.

It turns out, however, that the generation of an appropriate 'set' current pulse which reliably crystallizes the phase-change material is easier to accomplish in theory then in practice. The phase-change material is highly sensitive to process conditions, and as a result, the temperature range window associated with the crystallization 'set' current pulse is extremely narrow. As a result, the crystallization failure rate during programming of phase-change memory cells can be high.

SUMMARY OF THE INVENTION

According to an aspect of the present invention, a method of programming a memory array including a plurality of memory cells is provided. The method of this aspect includes applying in succession first through $n^{th}$ current pulses to each of the memory cells to be programmed to a first state, wherein a current amplitude of the first through $n^{th}$ current pulses decreases with each successive pulse, and wherein a pulse duration of the first through $n^{th}$ current pulses increases with each successive pulse.

According to another aspect of the present invention, a method of programming a memory array including a plurality of memory cells is provided. The method of this aspect includes applying a first current pulse to the memory array to at least partially program a corresponding memory cell to a first state, and applying in succession second through $n^{th}$ current pulses to the corresponding memory cell which was at least partially programmed to the first state by the first current pulse. A current amplitude of the first through $n^{th}$ current pulses decreases with each successive pulse, and a pulse duration of the first through $n^{th}$ current pulses increases with each successive pulse.

According to still another aspect of the present invention, a method of programming a memory array including a plurality of memory cells is provided. The method of this aspect includes applying at least one first current pulse to a memory cell of the memory array to program the memory cell into a first state, and applying at least one second current pulse to the memory cell while the memory cell remains in the first state. A current amplitude of the at least one first current pulse is greater than a current amplitude of the at least one second current pulse, and a pulse duration of the at least one first current pulse is less than a pulse duration of the at least one second current pulse.

BRIEF DESCRIPTION OF THE DRAWINGS

The above and other features and advantages of the present invention will become readily apparent from the detailed description that follows, with reference to the accompanying drawings, in which.

DETAILED DESCRIPTION OF PREFERRED EMBODIMENTS

Hereinafter, the present invention will be described in detail with reference to exemplary but non-limiting embodiments of the invention. It should be noted that the drawings are presented for illustrative purposes only, and are not necessarily drawn to scale.

Figure 1A:
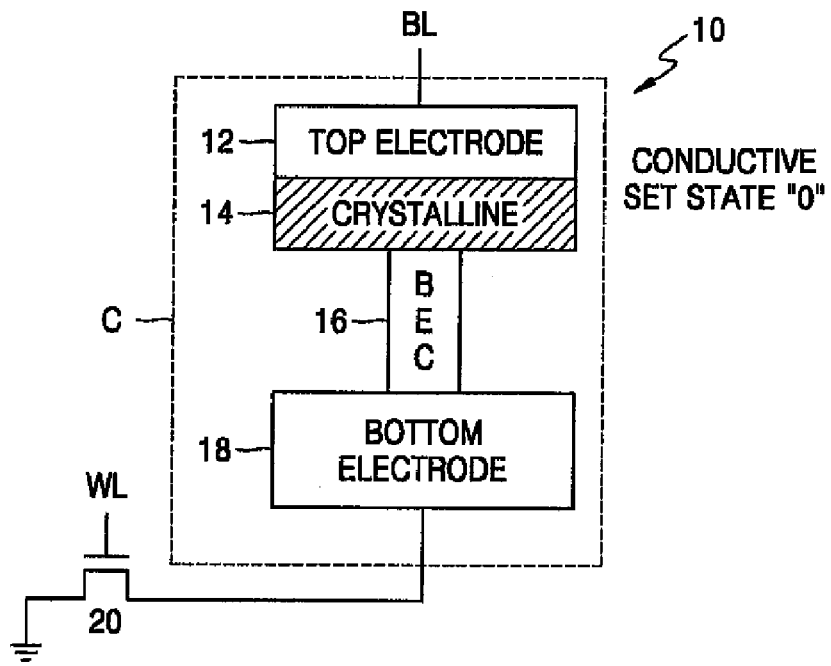
FIGS. 1A and 1B illustrate a phase-change memory cell in a 'set' state and in a 'reset' state, respectively.
Figure 1B:
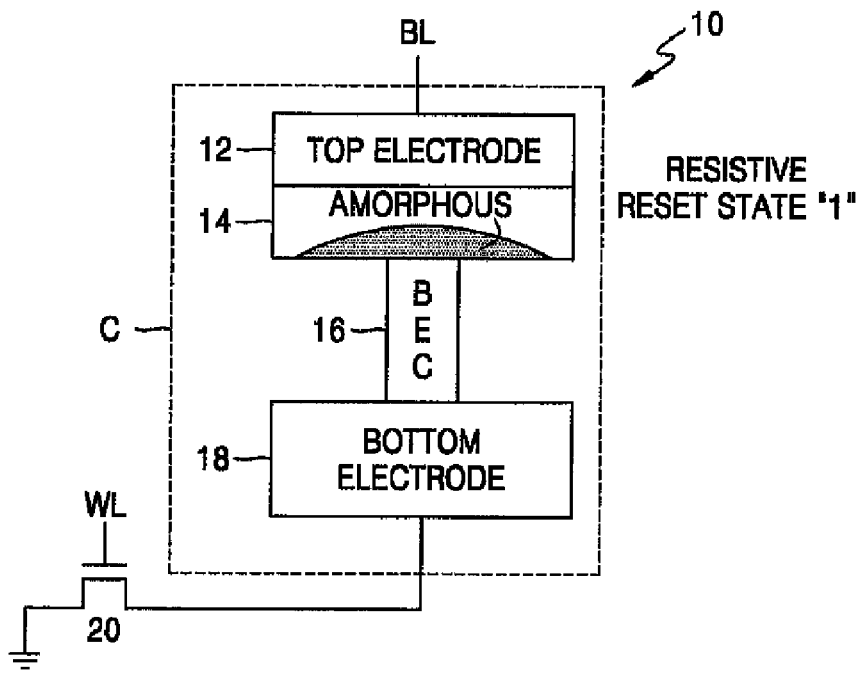
Figure 2:
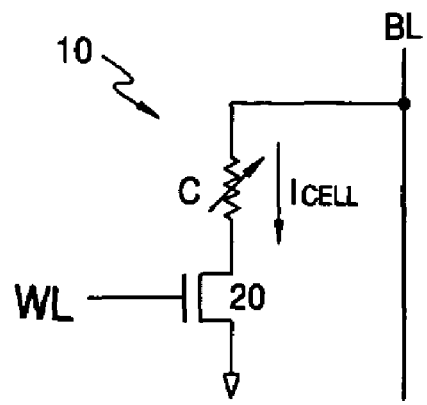
FIG. 2 is an equivalent circuit diagram of the phase-change memory cells of FIGS. 1A and 1B.
Figure 3:
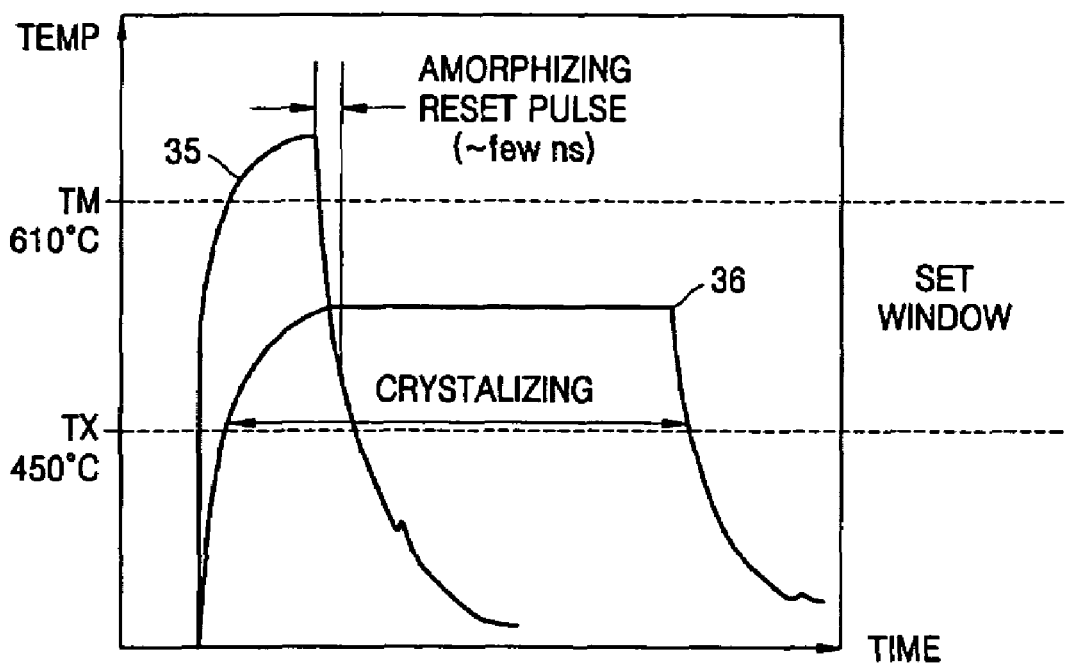
FIG. 3 is a graph temperature pulse characteristics of a phase-change material during programming of a phase-change memory cell.
Figure 4:
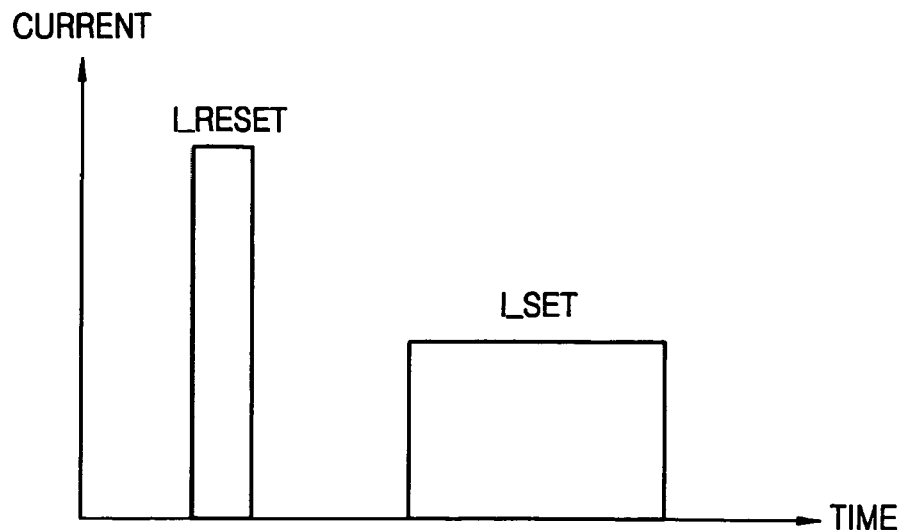
FIG. 4 is a diagram showing a 'set' current pulse and a 'reset' current pulse during programming of a phase-change memory cell.
Figure 5A:
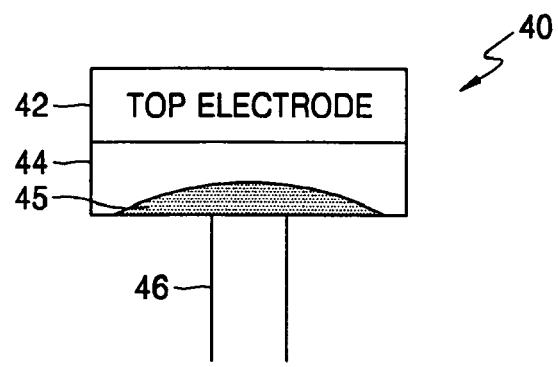
FIGS. 5A and 5B are diagrams for use in explaining how process conditions can cause material variations when programming a phase-change material to an amorphous state.
Figure 5B:
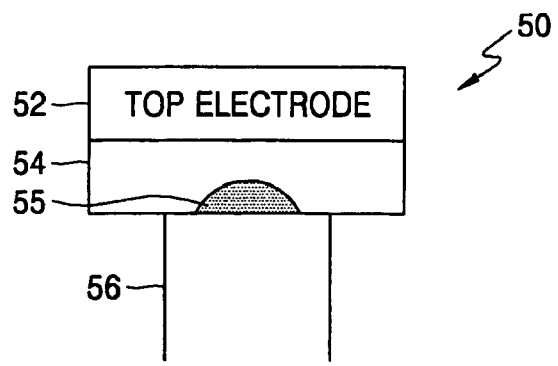

Reference is initially made to FIGS. 5A and 5B which respectively illustrate portions of memory cells 40 and 50 which, as a result of process variations, have bottom electrode contacts of different sizes.

In particular, FIG. 5A illustrates a first memory cell 40 having a top electrode 42, a phase-change material 44, and bottom electrode contact (BEC) 46. FIG. 5B illustrates a second memory cell 50 having a top electrode 52, a phase-change material 54, and a BEC 56. As is schematically shown, the BEC 56 of the second memory cell 50 is wider than the BEC 46 of the first memory cell 40.

The 'set' current pulses and 'reset' current pulses are applied to the phase-change material 44/54 through the BECs 46/56. The phase-change material 44/54 may include, for example, germanium (Ge), antimony (Sb), and tellurium (Te).

Since the contact area of the BEC 46 of FIG. 5A is smaller than the contact area of the BEC 56 of FIG. 5B, the contact resistance of FIG. 5A is larger than the contact resistance of FIG. 5B.

When identical 'reset' current pulses are applied to the memory cells 40 and 50, different amorphous characteristics will result from the differing BEC contact resistance of the two cells. That is, the heat produced in the memory cell 40 having the larger contact resistance will be greater than the heat produced in the memory cell 50 having smaller contact resistance. Thus, as illustrated in FIGS. 5A and 5B, the volume 45 of amorphous material of the phase-change material 44 of the first memory cell 40 will be larger than the volume 55 of amorphous material of the phase-change material 54 of the second memory cell 50.

The differing contact resistances also impact 'set' programming. That is, assuming that the magnitude of the power required for the memory cells 40 and 50 to enter a 'set' state is the same, the amplitude of the 'set' current pulse applied to the memory cell 50 having the smaller contact resistance must be greater than the amplitude of the 'set' current pulse applied to the memory cell 40 having the larger contact resistance.

Further, the differing volumes of amorphous material 45 and 55 further impact 'set' programming. That is, since the volume of amorphous material 45 of the first memory cell 40 is larger the volume of amorphous material 55 of the second memory cell 50, a 'set' current pulse of longer duration is needed to crystallize the phase-change material 44 of the first memory cell when compared to the duration of the 'set' current pulse needed to crystallize the phase-change material 54 of the second memory cell 50.

Thus, the ideal 'set' current pulses for the two memory cells 40 and 50 differ from one another. The 'set' current pulse for the first memory cell 40 (having the larger contact resistance) should have a relatively small amplitude and relatively long duration. In contrast, the 'set' current pulse of the second memory cell 50 (having the smaller contact resistance) should have a relatively large amplitude and a relatively shorter duration.

Programming methods according to embodiments of the present invention will now be described which increase the probability that phase-change memory cells having differing contact resistances will be properly crystallize during 'set' programming operations.

The embodiments that follow are generally characterized by a method of programming a memory array including a plurality of memory cells, where the method includes applying in succession first through $n^{th}$ current pulses to each of the memory cells to be programmed to a first state (e.g., a crystalline state). The current amplitude of the first through $n^{th}$ current pulses decreases with each successive pulse, while the pulse duration of the first through $n^{th}$ current pulses increases with each successive pulse.

Hence, 'set' current pulses having several amplitude levels and several pulse widths are applied to the memory cells during each set programming operation, and therefore, the probability of successfully programming all the memory cells into the crystalline state is increased.

Figure 6:
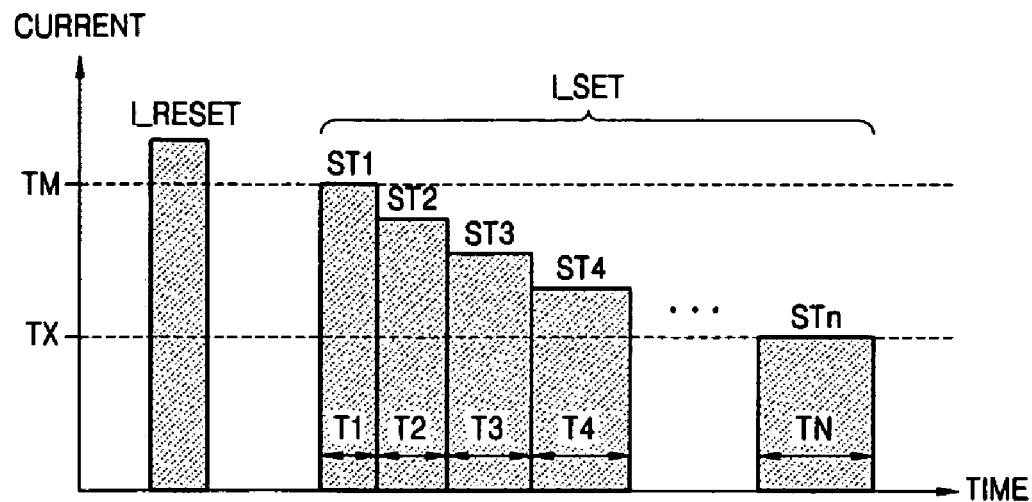
FIG. 6 is a diagram illustrating waveforms of programming current pulses according to an embodiment of the present invention.

FIG. 6 illustrates waveforms of current pulses that are applied to memory cells during programming of a memory array according to one specific embodiment of the present invention.

Referring to FIG. 6, the 'set' current pulse I_SET is defined by a succession first through $n^{th}$ current pulses. As shown, the current amplitude ST1-STn of the first through $n^{th}$ current pulses ST1-STn decreases with each successive pulse. On the other hand, the pulse duration T1-TN increases with each successive pulse. In this embodiment, the first through $n^{th}$ current pulses are applied immediately one after the other without an intervening interval there between. Herein, "n" is a positive integer of at least 2. Preferably "n" is equal to 3 or more, and more preferably, "n" is equal to 4 or more.

As is apparent from the above, the first 'set' current pulse has the largest current amplitude ST1 and the shortest duration T1, while the last ($n^{th}$) 'set' current pulse has the smallest current amplitude STn and the longest duration TN.

Also, the current amplitude of the first 'set' current pulse is preferably equal to or less than the melting temperature TM, while the current amplitude STn of the last ($n^{th}$) 'set' current pulse is preferably equal to or greater than the crystallization temperature TX. The temperatures TM and TX define the 'set' window for the memory cells of the memory array. In other words, the current amplitude of the first current pulse is preferably equal to or less than a maximum current amplitude needed to change the state of each of the memory cells to the crystalline state, and less than a current amplitude needed to change the state of each of the memory cells to the amorphous state. The current amplitude of the last ($n^{th}$) current pulse is preferably equal to or more than a minimum current amplitude needed to change the state of each of the memory cells to the crystalline state.

Also, it is preferable that the first 'set' current pulse (having amplitude ST1 and pulse duration T1) be sufficient to partially or even fully crystallize the previously amorphous material of the phase-change memory cell. In this case, crystallization may be enhanced (or stabilized) by the subsequent second through $n^{th}$ 'set' current pulses.

Figure 7:
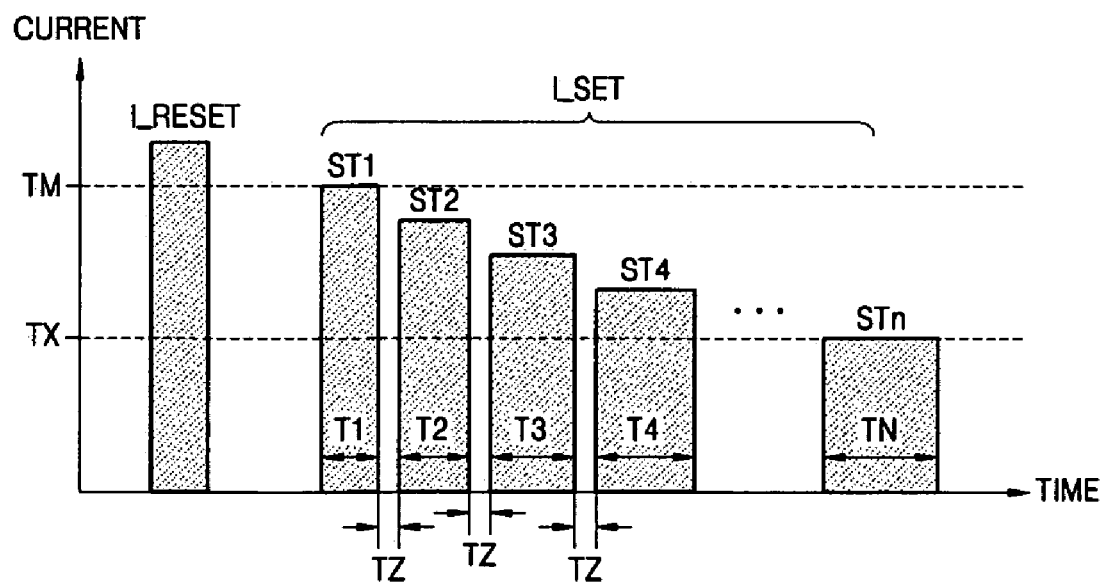
FIG. 7 is a diagram illustrating waveforms of programming current pulses according to another embodiment of the present invention.

FIG. 7 illustrates waveforms of current pulses that are applied to memory cells during programming of a memory array according to another specific embodiment of the present invention.

The 'set' current pulse I_SET of FIG. 7 is the same as that of FIG. 6, except that the first through $n^{th}$ current pulses are applied with intervening intervals TZ there between in which no current is applied. The relative current amplitudes and pulse durations of the first through $n^{th}$ current pulses of FIG. 7 are the same as FIG. 6, and accordingly, a detailed description thereof is omitted here to avoid redundancy.

Incidentally, each of FIGS. 6 and 7 illustrate an example of the 'reset' pulse I_RESET. As shown, the current amplitude of the 'reset' pulse I_PRESET is greater than the melting temperature TM, and the duration of the 'reset' pulse I_RESET is less than that of the 'set' pulse I_SET.

As described above, plural 'set' current pulses having several amplitude levels and several pulse widths are applied to the memory cells during each set programming operation. Accordingly, the probability of successfully programming memory cells having different contact resistances into the crystalline state is increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of programming a memory array including a plurality of memory cells, said method comprising:

applying a programming current to a memory cell of the memory array to program the memory cell, wherein the programming current consists of a first current pulse which at least partially programs a corresponding memory cell to a first state, and second through $n^{th}$ current pulses which are applied in succession to the corresponding memory cell which was at least partially programmed to the first state by the first current pulse, wherein n is an integer of 3 or more;

wherein a current amplitude of the first through $n^{th}$ current pulses decreases with each successive pulse, and wherein a pulse duration of the first through $n^{th}$ current pulses increases with each successive pulse.

2. The method of claim 1, wherein the current amplitude of the $n^{th}$ current pulse is equal to or more than a minimum current amplitude needed to change the state of each of the memory cells to the first state.

3. The method of claim 1, wherein the current amplitude of the first current pulse is equal to or less than a maximum current amplitude needed to change the state of each of the memory cells to the first state.

4. The method of claim 1, wherein the memory cells are programmable between the first state and a second state, and wherein the current amplitude of the first current pulse is less than current amplitude needed to change the state of each of the memory cells to the second state.

5. The method of claim 4, wherein each of the memory cells includes a phase-change material, and wherein the first state is a crystalline state and the second state is an amorphous state.

6. The method of claim 5, wherein the phase-change material includes germanium (Ge), antimony (Sb), and tellurium (Te).

7. The method of claim 1, wherein the first through $n^{th}$ current pulses are applied immediately one after the other without an intervening interval there between.

8. The method of claim 1, wherein the first through $n^{th}$ current pulses are applied with intervening intervals there between in which no current is applied.

* * * * *